United States Patent [19]
Saito

[11] 4,125,875
[45] Nov. 14, 1978

[54] FAULT TOLERANT SHIFT REGISTER TYPE MEMORY DEVICE

[75] Inventor: Nobuo Saito, Mitaka, Japan

[73] Assignee: Hitachi, Ltd., Japan

[21] Appl. No.: 675,338

[22] Filed: Apr. 9, 1976

[30] Foreign Application Priority Data

Apr. 11, 1975 [JP] Japan .................................. 50-43203

[51] Int. Cl.² ............................................ G11C 19/08
[52] U.S. Cl. ......................................... 365/1; 365/15; 365/12
[58] Field of Search ...... 340/173 R, 173 RC, 173 BB, 340/173 DR, 174 TF; 365/1, 15, 12

[56] References Cited

U.S. PATENT DOCUMENTS

| 3,909,810 | 9/1975 | Naden et al. ................... 340/174 TF |
| 4,001,673 | 1/1977 | Barrett ............................ 340/174 TF |

*Primary Examiner*—James W. Moffitt
*Attorney, Agent, or Firm*—Craig & Antonelli

[57] ABSTRACT

A shift register type memory device according to this invention includes on the same chip as that of an information storing medium, a functional part which identifies defect loops and controls the writing and reading of information so as to exclude them. The functional part includes a defect loop address memory which stores locations of the defect loops in the binary expression, and a common detector which reads out information from the defect loop address memory and information from storage loops.

12 Claims, 10 Drawing Figures

FAULT TOLERANT SHIFT REGISTER TYPE MEMORY DEVICE

BACKGROUND OF THE INVENTION

1. Field of the Invention

This invention relates to a memory device which employs a plurality of shift registers.

While this invention is applicable to all sorts of memories employing shift registers, it will be specifically described in the case of magnetic bubbles in the present specification.

2. Description of the Prior Art

The principle of magnetic bubbles was discovered by Andrew H. Bobeck of Bell Telephone Laboratories, Inc. and his associates, and is being extensively investigated for memory devices. The details are described in "Magnetic Bubbles" by A. H. Bobeck et al., Scientific American, Vol. 224, June 1971, pp. 78-91. With the progress of magnetic bubble technology, memory devices exploiting it have become increasingly large in capacity. One of problems in the fabrication of a large-capacity magnetic bubble chip is posed by a defect in the magnetic substance which holds the magnetic bubbles and a defect in the permalloy pattern which is made thereon. As the capacity of a chip becomes larger and the density becomes higher, the probability that the whole chip becomes defective and will have to be discarded on account of only one defect becomes higher. That is, the yield is lowered, and the desire to reduce the bit cost by large capacity and high density is nullified.

Let it be supposed that even when a chip including 256 loops has two defective loops, it is usable. Assuming that the probability at which the chip has no defect is 10%, that the probability at which it has one defective loop is 26% and that the probability at which it has two defects is 32%, then the yield is the sum of the probabilities, i.e., about 70%. In other words, the yield increases to 7 times greater, and the bit cost is reduced to 1/7.

In a construction in which a memory portion for information is made up of a single shift register only, if a defect exists in any place on the loop, there will be no expedient for avoiding the defective loop because all the bubbles pass through the defect. In contrast, in a major-minor type organization, the memory portion is divided into independent minor loops, and hence, a control for avoiding the use of loops including defects is possible.

To this end, a defective loop memory circuit is provided outside the memory chip. Prior to the operations of reading, writing and erasure, the addresses of the defective loops are detected from the defective loop memory circuit, whereby the control sequence of a rearrangement circuit for a pulse train is determined. Subsequently, information is read out from the memory chip, and the pulse train having been disarranged on account of the defective loops not to be used is restored to the correct pulse train by the pulse train rearrangement circuit. The writing is similar, and is executed in such a way that the pulse train rearrangement circuit rearranges the pulse train of correct order into the disordered pulse train in accordance with the defective loops not to be used.

Unless the defect loop address memory is non-volatile, the defective loop address information will be lost and will become unrecoverable upon disconnection of the power supply. Unless the address memory is low in bit cost, its cost will not be negligible. Since the magnetic bubble memory is non-volatile, it can be utilized for the defective loop address memory. For example, U.S. Pat. No. 3,792,450 discloses a defective loop address memory which is formed on the same chip as that of the storage loops.

In the device disclosed in the above-referenced U.S. patent, a "1" is written into respective minor loops, After the information goes round each minor loop shifted to a major loop through a transfer gate. In that case, the information cannot pass through loops including defects. The information shifted to the major loop is subsequently stored into a defective loop address memory. The defective loop address memory information is read out by the use of a detector separate from the one provided for storage loops before information from the storage loops are read out. That is, the defective loop address memory consists of minor loops in the number of bits equal to the number of the storage loops. One bit is allotted to each loop, and whether the loop is a defective one or an operative one is represented by the designation "1" or "0", respectively.

The prior-art device accordingly has the advantage that it can be used even in the case where most of the minor loops are defective loops. It is disadvantageous, however, in that the number of bits increases with the memory capacity, the access time becoming undesirably long.

By way of example, assume that up to four defective loops are permitted in a chip of the major-minor type organization being of 1 M bits per chip and having 512 minor loops. Chips which have five or more defective minor loops are of a slight number. Even when they are made defective chips, the overall yield scarcely changes.

In such case, the access time increases by 1024-bit time with the bit expression of the respective loops as stated above. The access time is effectively doubled in comparison with the access time in the case where the defective loop address memory is not provided. Moreover, according to the prior-art device, each chip has an individual detector for reading out defective loop addresses, so that peripheral circuits become considerably bulky.

SUMMARY OF THE INVENTION

An object of this invention is to provide a shift register type memory device which avoids the use of defective loops without increasing the access time and without employing bulky peripheral circuits and control circuits.

In order to accomplish this object, the system according to this invention which identifies defective loops and controls the writing and reading of information so as to exclude them and which is formed on the same chip as that of an information storing medium comprises a defective loop address memory which stores the locations of defective loops in binary expression, and a common detector which reads out information from the defective loop address memory and information from the storage loops. Information to be written is stored into the storage loop as the defective loops are avoided by means of a pulse train control circuit on the basis of the defective loop address information detected by the detector. Information read out is rearranged into an ordinary information pulse train by means of the pulse train control circuit on the basis of the defective loop address information read out previously thereto.

By way of example, in the foregoing case where up to four defective loops are allowed in a chip of the major-minor type organization being of 1 M bits per chip and having 512 minor loops, the access time in the prior-art system increases by 1024-bit time, whereas according to this invention one minor loop can be expressed by a binary number of 9 bits so that the storage of defective loop addresses requires only $9 \times 4 = 36$ bits and that the access time increases only 72-bit time. The defective loop address memory in this invention is much smaller than in the prior-art device, and the information from the defective loop address memory and the information from the storage loops are read by the common detector, so that the advantage of the simplification of peripheral circuits is brought forth.

While other features and advantages of this invention will be hereinbelow described more in detail in connection with embodiments with reference to the drawing, it is a matter of course that they are merely for illustration and that a variety of modifications and improvements can be made without departing from the spirit and scope of this invention.

DESCRIPTION OF THE PREFERRED EMBODIMENTS

Embodiment 1

Figure 1:
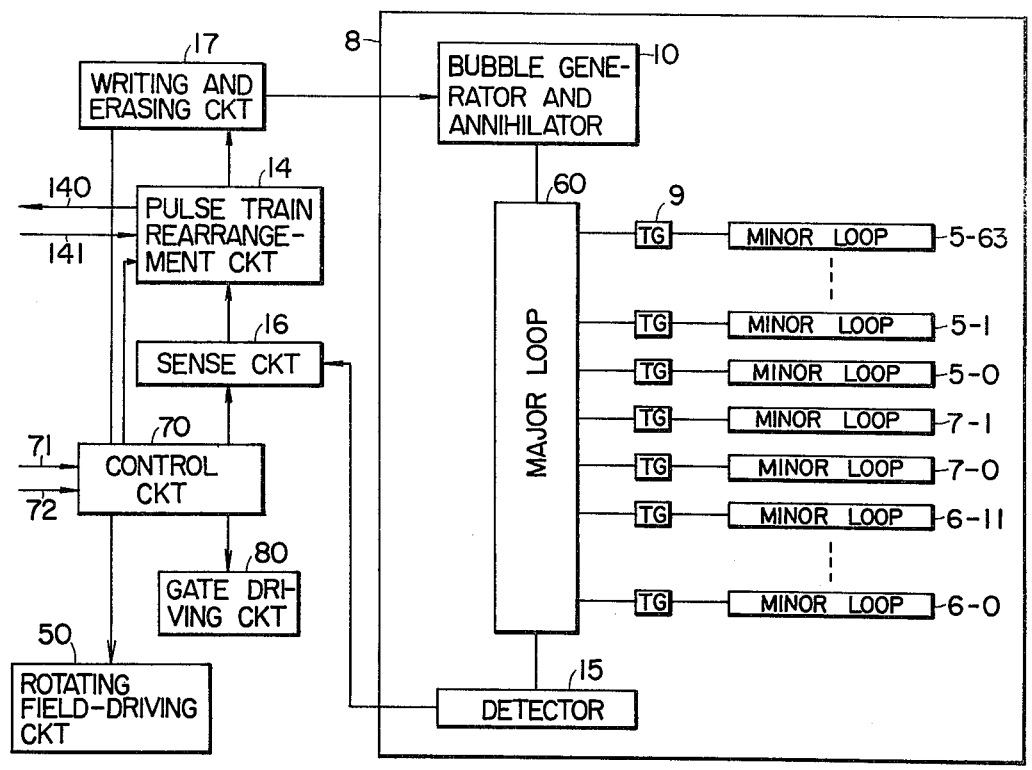
FIG. 1 is a constructional view of a shift register type memory device showing one aspect of performance of this invention.

As shown in FIG. 1, the shift register type memory device according to this invention comprises, for example, 64 storage loops or data loops 5-0, 5-63, and 12 defective loop location memories or address loops 6-0 to 6-11. References 7-0 and 7-1 designate alternative loops.

Let it now be supposed that, when a 16 $k$ ($k=1024$)-bit bubble memory chip 8 having 64 minor loops of 256 bits is to be made, up to two defective loops are allowed. Then, $\alpha = 64 + 2 = 66$. Since the loop addresses of the 64 loops can be expressed by 6 bits two addresses are expressed by 12 bits. The two defective loop addresses are therefore expressed by 12 bits, and are stored into the address loops 6-0 through 6-11.

Identical "1" or "0" is written in all the 256 positions on each of the address loops (minor loops) 6-0 to 6-11, so that in case of the transfer-out operation (the operation of transfer through the transfer gate 9 from the minor loop to the major loop) of a bubble at an arbitrary position on the data loops 5-0 to 5-63, the same defective loop address information or defective loop location information comes out from the address loop onto the major loop at any time. Numeral 50 indicates a rotating field-driving circuit.

Here, it is assumed for example that the data loops 5-0 and 5-1 are defective loops. "000000000001" is entered into the address loops 6-0 to 6-11. Here, the first six bits represent "0", and the second six bits represent "1". That is, "0" is stored in the address loops 6-0 to 6-10, and "1" in the address loop 6-11. Of course, "1" is stored at all the positions on the address loop 6-11, and "0" at all the positions on the other 11 address loops.

The writing and erasure can be carried out with a writing and erasing circuit 17 in a similar manner to the usual writing into and erasure from data loops. In this case, input and output data are respectively provided on lines 141 and 140. A bubble generator and annihilator at this time is shown at 10.

Where the data loops 5-7 and 5-31 have defects, "000111011111" is written into the address loops 6-0 to 6-11. Here, the first six bits represent "7," and the latter six bits represent "31."

When there is no defective loop, "111110111111" is written. That is, when there is no defective loop, it is presumed that the data loops 5-62 and 5-63 are defective loops, so that the alternative loops 7-0 and 7-1 are used, and the data loops 5-62 and 5-63 are made idle. The chip in which any of the alternative loops 7-0 and 7-1 and the address loops 6-0 to 6-11 are defective must not be used, and it is herein assumed that these loops have no defect.

In case of performing the read-out operation, the coincidence between a minor loop counter included in a control circuit 70 (a counter indicating what bit address is alive directly under a transfer gate on the minor loop) and a bit address to be read out provided on lead 71 from the exterior (an address on the minor loop) is detected in response to a control signal 72. A gate driving circuit 80 is thus operated to transfer out bubbles in parallel from ($n+p$) minor loops 7-0 and 7-1 and 5-0 to 5-63 to a major loop 60.

When the bubbles are read out by a detector 15, the defective address information consisting of 12 bits from loops 6-0 to 6-11 is read out at first. It is fed to a pulse train rearrangement circuit 14 through a sense circuit 16, and determines the operating sequence thereof. Subsequently, storage loop information of 66 bits (from loops 7-0, 7-1 and 5-0 to 5-63) is read out, and a pulse train having been disarrranged due to the existence of the defective loops is rearranged into a regular order and delivered on line 140 by circuit 14.

Since the chip is of 16 $k$ bits in this case, the area which is occupied by the address loops and the alternative loops is $14/78 = 17.9\%$ of the whole area. The proportion becomes smaller as the number of bits per chip increases. By way of example, consider a chip of 1 M ($M = 1024^2$) bits having 512 data loops of 2048 bits, and assume that up to eight defective loops are allowed.

Nine bits are required in order to represent 512 loop addresses, so that 72 defective address loops are necessary. In this case, accordingly, the proportion which the address and alternative loops occupy becomes $80/592 = 13.5\%$. That is, a non-volatile semiconductor memory being expensive may be dispensed with by the redundant area which is in general range of 10%.

The component of increase of the access time due to this method corresponds merely to the fact that the 12minor loops are interposed between the first data loop (the alternative loop 7-0 in this case) on the major loop and the detector in FIG. 1 and that the distance increases by 24 bits. The increment is only 19% as compared with the average 128-bit time (a half of the number of bits of the minor loops).

The foregoing embodiment has been handled as having no defect in the alternative loops 7-0 and 7-1. However, even in case where the alternative loops have defects, the whole device can easily be made operative if the number of defective loops is two or less among the alternative loops 7-0, 7-1 and the storage loops 5-0 to 5-63.

The above description relates to the case of block access where all the magnetic bubble information is transferred out onto the major loop by one transfer gate operation in the bubble memory chip of the major-minor type organization.

The magnetic bubble memory chip of the major-minor type organization has another manner of use of the bit access in which only 1 bit is read out from one major-minor loop. In this case, the only difference is that when information is transmitted to the exterior, the predetermined time position (timing) shifts on account of the presence of defective loops.

Originally, unless a memory is of perfect random access, the access time varies in dependence on an address requested. Accordingly, even when the timing at which information comes out shifts by several bits on account of the presence of defective loops due to defects of the chip, this poses no problem. The bit time which need be awaited on account of the presence of defective loops is negligible as compared with the bit time for the essential access.

By way of example, in case of the foregoing 16 $k$-bit chip, the access becomes slower by 28-bit time by reason of the employment of this system. Since, however, the intrinsic access time is $256 \times (3/2) = 384$-bit time or above, the increment is only 6.8%. That is, in the case of the bit access, the proportion by which the access time is degraded by this invention is several % or below, and it is ⅓ or below as compared with that in the case of the block accesss. In the case of the 1 M-bit chip, the proportion is only 2.4% and is almost negligible.

The cycle time which is another basic performance of a memory is not changed by this invention. The reason is that, in case of the large-capacity non-volatile memory device, the cycle time is the bit time twice as large as the number of bits of the minor loops.

As set forth above, according to the present embodiment, the chip including the defective loops can be operated as if it were a chip including no defective loop without using the expensive non-volatile external memory as the defective loop memory device and without exerting any substantial evil influence on the basic performances of the memory such as access time and cycle time.

The parts added anew or made complicate by reason of the application of this invention, such as the pulse train rearrangement circuit 14, the control circuit 70, etc. in FIG. 1, are not proportional to the number of chips. As the capacity becomes larger, the component of increase of the peripheral circuit or control circuit can be neglected, and only the enhancement of the yield owing to the permission of the defective loops becomes more effective.

A concrete example of the pulse train rearrangement circuit 14 will now be explained with reference to FIG. 2 in the case of the read-out operation. In a figure, a part 14 enclosed with broken lines corresponds to the pulse train rearrangement circuit.

When an address to be read out is fed from a CPU (central processing unit) by an address line 46, the contents are stored in a minor loop address register 20. The addresses to be designated by the CPU include, not only those within the minor loop, but also those addresses for selecting chips. For the sake of simplicity, however, the latter will not be referred to.

Subsequently, a signal line 47 which indicates the rotating state of an in-plane magnetic field is enabled on the basis of a read-out instruction indicating beginning of rotation of the in-plane magnetic field. At the same time that the in-plane magnetic field begins to rotate, a minor loop address counter 18 starts counting clock pulses on line 48.

A coincidence circuit 19 checks the coincidence between the contents of the minor loop address counter 18 and the minor loop address register 20 at all tims, and provides an output pulse when coincidence is detected. A transfer-out control flip-flop (hereinafter, abbreviated to "F · F") 21 is turned "on" by the output pulse of circuit 19. By an output of the F· F 21, a transfer gate driving circuit (not shown) is actuated to conduct the transfer-out operation.

The F· F 21 is automatically turned "off" in one cycle, and simultaneously triggers a major loop counter 22. The major loop counter 22 counts the pulses on line 48, and returns to zero when it has reached a count equal to the number of bits of the major loop. Although no illustration is made in the figure, a transfer-in control flip-flop (not shown) is actuated to conduct the transfer-in operation when the major loop counter 22 reaches the maximum value.

On the other hand, after the transfer-out or after lapse of a certain number of cycles (here, after 82 cycles), the first one of the bubbles transferred out from a sense amplifier 27 arrives directly under a detector 15 and is read out. Referring to FIG. 1, 12 bits from the first bubble are address bits indicative of a defective address. (the The 12 bits shall be 24 cycles here. In general, in the chip of the major-minor type organization, the bubbles after the transfer-out are usually at every second bit. Although this does not always hold as to the major-minor chips, the bubbles are assumed to be at every second bit.) Thereafter, the two bits of data of the alternative loopes 7-0 and 7-7 four cycles are obtained.

At the output of the sense amplifier 27, two delay elements 31 and 32 (each having 1 bit = 1 cycle) are incorporated. Therefore, the data loop 5-0 is read out at the last point when 82 + 24 (defective address) + 4 (alternative loop) +2 (delay) = 112 cycles proceed after the transfer-out begins. The major loop counter 22 indicates 112 at that time.

Accordingly, when the counter reaches a value obtained by adding the defective address to the value 112, the data read out from the defective loop appear at an output 41 of the first delay element 32. At this time, data of a loop next to the deflective loop, i.e., the next correct data appear at an output 40 of the second delay element 31.

The two defective addresses thus read out from the sense amplifier 27 are fed to an adder circuit 28 through an output line 42. On the other hand, the fixed number 112 is applied to another input 43 of the adder circuit 28, so that an adder circuit output of the first defective address is set in a first timing register 25. This valve signifies that the data of the first defective loop will appear at the output of the first delay element 32 when the value of the major loop counter 22 becomes equal thereto.

Likewise, the second defective address has 112 added thereto and then has 1 subtracted, and the result is set in a second timing register 26. When this value is judged to coincide with the contents of the major loop counter 22 by a coincidence circuit 24, the data of the second defective loop appears at the output of the second delay element 31.

Outputs of the first timing register 25 and the major loop counter 22 are monitored by a coincidence circuit 23 at all times, and a first delay inhibit flip-flop 30 is inverted at the coincidence. Usually, the flip-flop 30 is set at "0", and "0" appears at a "1" output line 35 while "1" appears at a "0" output line 36.

Likewise, "0" appears at a "1" output line 33 of a second delay inhibit flip-flop 29, while "1" appears at a "0" output line 34. At first, therefore, AND gates 37 and 38 are closed and only an AND gate 39 is opened, and the first delay element output 41 passes gate 44 and appears at an output 45.

When the output appears from the coincidence circuit 23 to invert the first delay inhibit flip-flop 30 and to set it to "1", "1" appears at the "1" output line 35 and "0" at the "0" output line 36. Then, the AND gates 37 and 39 are closed, and the AND gate 38 is opened. At this time, accordingly, the output 40 of the second delay element appears at the output 45. The defective loop data lying at the first delay element output 41 are discarded, while the data of the next good loop appearing at the second delay element output 40 are picked up. Thus, the normal pulse train is transmitted to the output 45 without causing a vacant space at the part of the defective loop.

Figure 2:
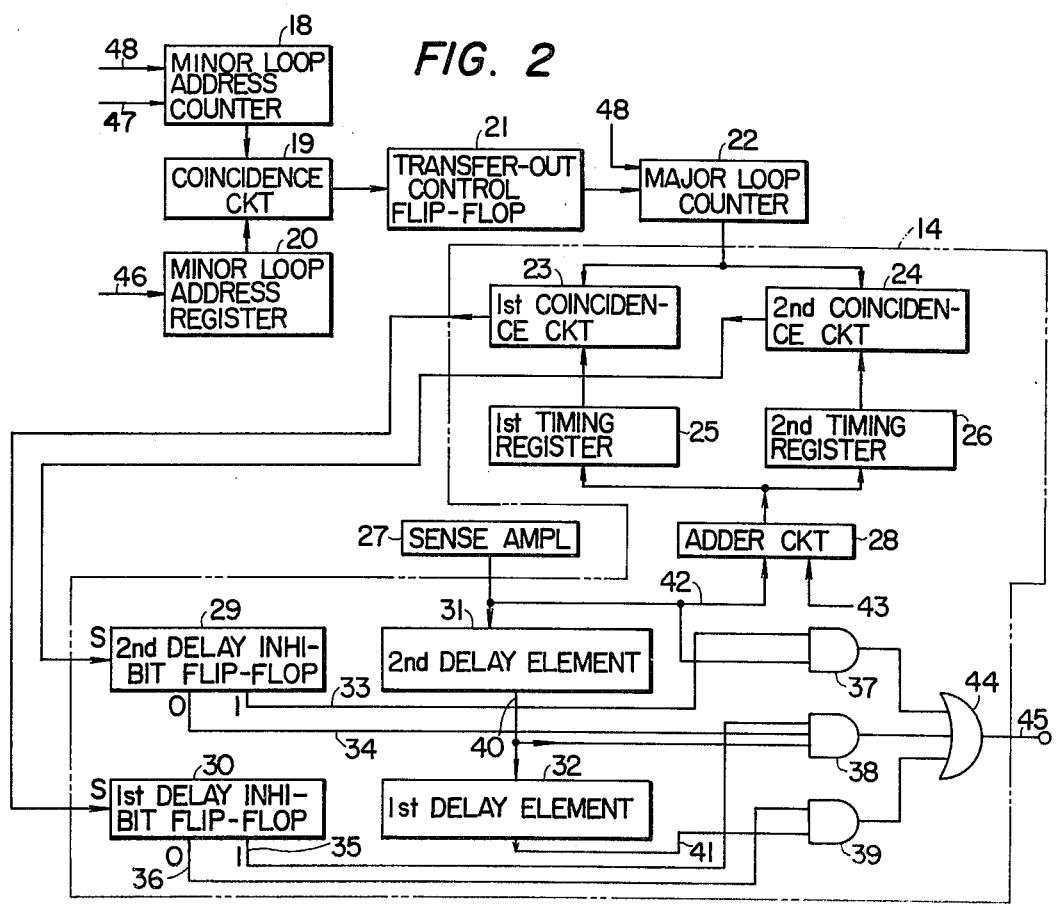
FIG. 2 is a block diagram of a pulse train rearrangement circuit.

Although omitted from the description, the writing is almost the same as the case of read-out in FIG. 2.

EMBODIMENT 2

In Embodiment 1, the identical information is written into all the positions in each of the address loops 6-0 to 6-11. This is based on the fact that whatever bit addresses in the minor loop are read out, the same defective loop address need come out. To this end, however, the address loop is not always required, but it may be replaced with an idler 100 of 1 bit as shown by a circle of one-dot chain line in FIG. 3A. Of course, wiring patterns 200 of the respective transfer gates are made series with each other. Numerals 60, 400 and 500 denote a major loop, an address loop and an alternative loop, respectively. FIG. 3B is an enlarged view of the idler, in which numeral 300 designates a permalloy pattern.

It also applies to Embodiment 1 that the wiring patterns of the transfer gates for data and those of the transfer gates for addresses are connected in series. The wiring patterns, however, need not be always in series but may be in parallel. They need not be connected within the chip, but they may be individually taken out to the exterior. Individual driver circuits may be used instead of the common transfer gate driving circuit. What is essential is that the address bubble comes out before the data bubble.

EMBODIMENT 3

Figure 3A:
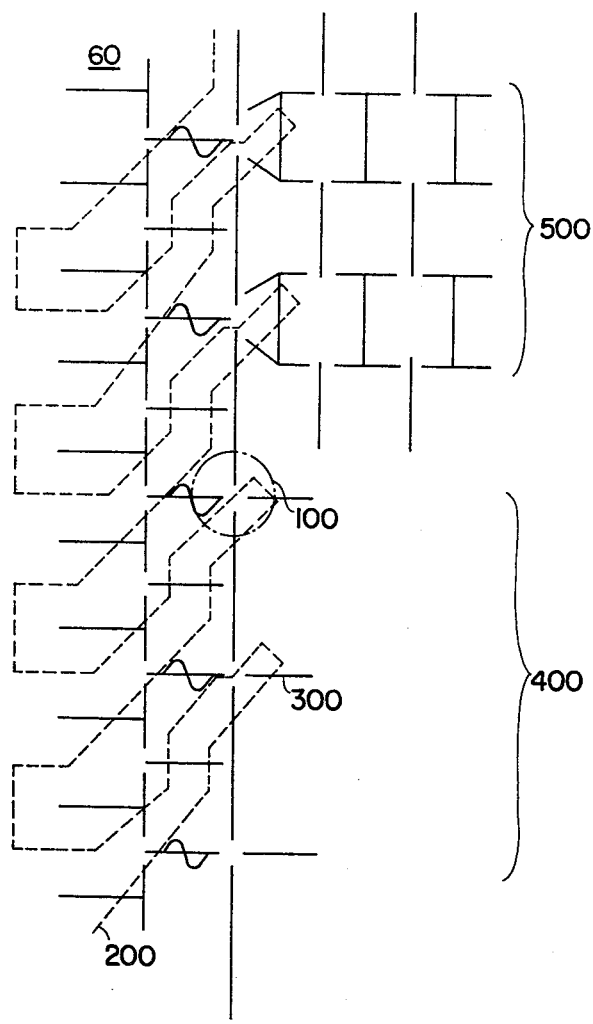
FIG. 3A is an explanatory view showing another aspect of performance of this invention.
Figure 3B:
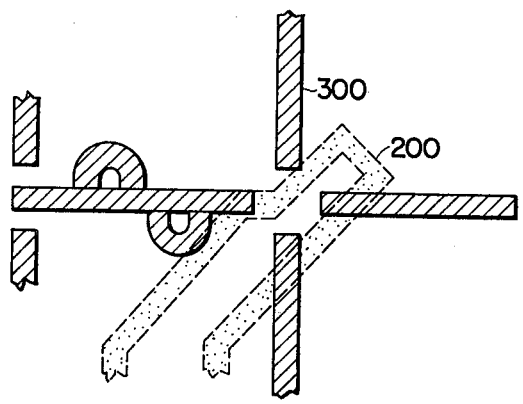
FIG. 3B is an enlarged view showing idlers in FIG. 3A.
Figure 4:
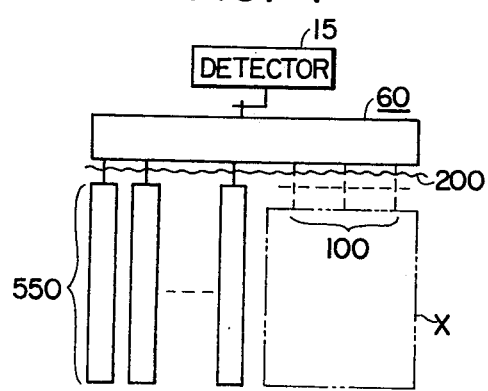
FIG. 4 is an explanatory view showing the whole chip in FIG. 3A.

A view of the whole chip in FIG. 3A is as given in FIG. 4. A large useless area X is defined by the side of the idler 100. In FIG. 4, numeral 15 represents the detector, 200 the transfer gate wiring, 550 data loops, and 60 the major loop. It is impossible from the standpoint of the special character of the magnetic bubble circuit to simply bend such a bubble circuit or change the direction thereof, but some measures are possible giving proper consideration to the technology.

Figure 5:
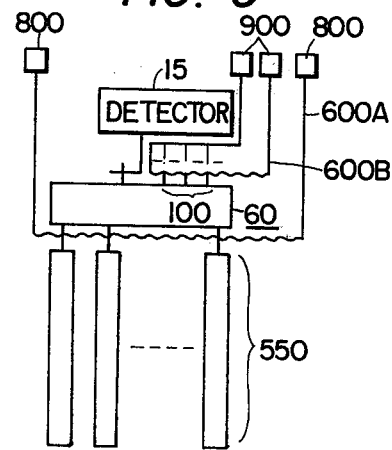
FIG. 5 is an explanatory view showing an example in which a part of the arrangement in FIG. 4 is modified so as to eliminate a useless area.

Since the thick film chevron expander detector is employed in the memory chip of the usual major-minor organization, the area which the detector occupies is large. As shown in FIG. 5, accordingly, the idler 100 can be placed on the major loop below the detector 15 situated on the side opposite to the transfer gate for data. Symbols 600A, 600B, 800, and 900 denote a transfer gate wiring for addresses, a transfer gate wiring for data, and their bonding pads, respectively. To be noted here is the sense of the transfer gates.

Figure 6:
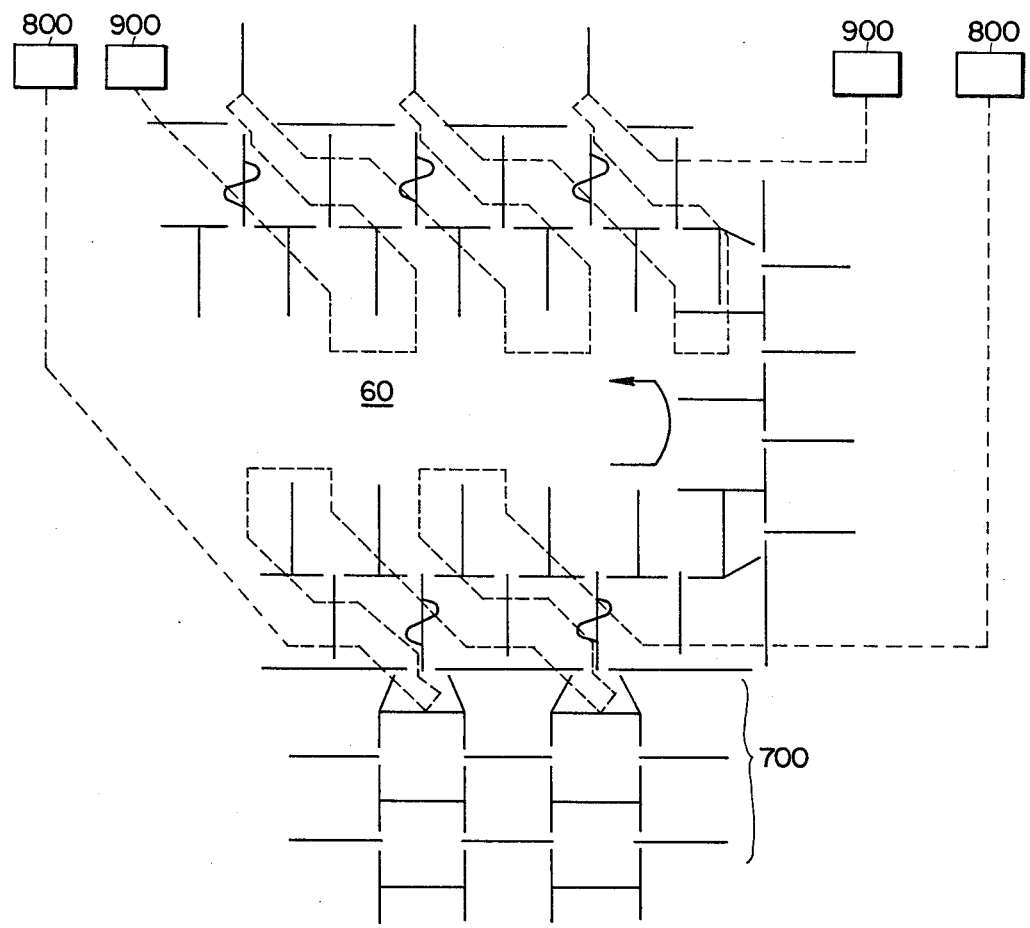
FIGS. 6 and 7 are explanatory views each showing a concrete example of a pattern according to the system in FIG. 5, and FIGS. 8 and 9 are explanatory views showing an aspect of performance in which a replicator is employed for reading out defective loop addresses.

An example of a specific pattern in this case is illustrated in FIG. 6. This corresponds to a case where the idler and a minor loop 700 are disposed outside the major loop 60. Since the operating phases of the transfer gates differ by 180° between on and under the major loop, the two wiring patterns cannot be commonly connected, and they need be led out to individual bonding pads 800 and 900 and be driven by separate driver circuits.

Figure 7:
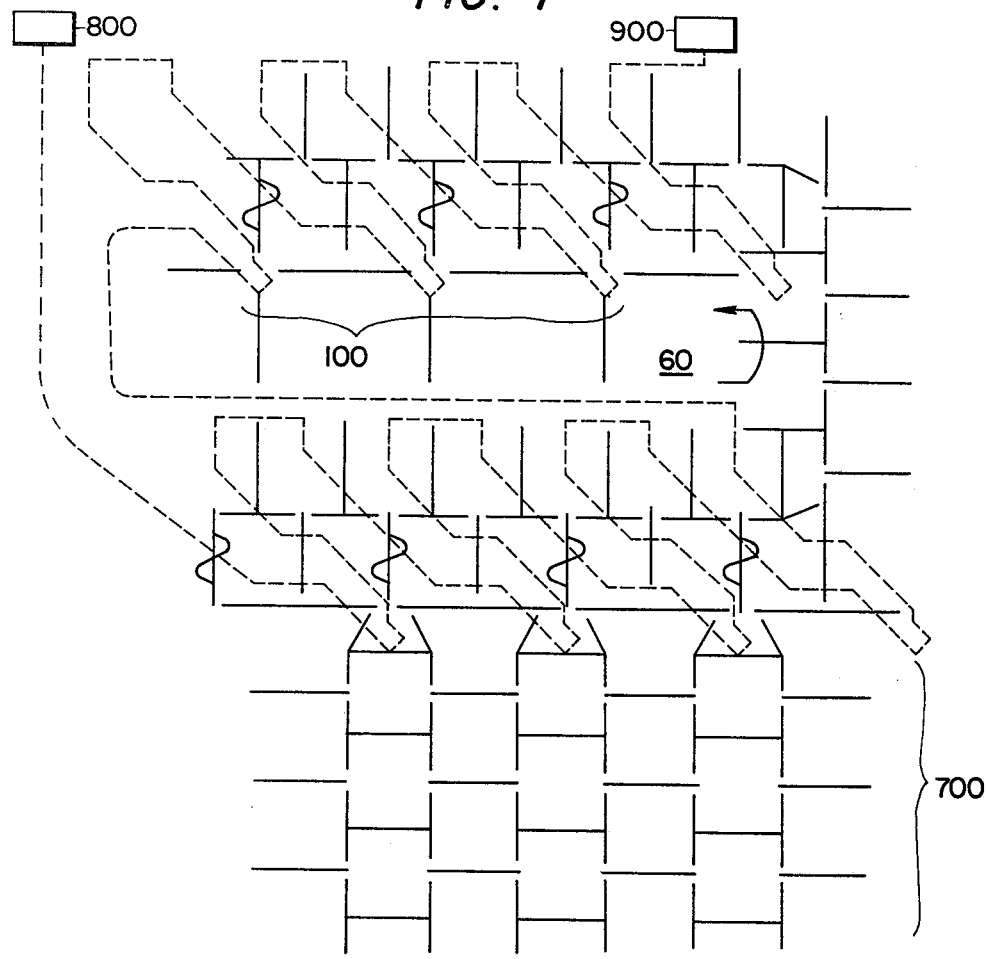

FIG. 7 illustrates a case where the idler is formed inside the major loop 60 and where the operating phases of the transfer gates are made the same for the idler and the minor loop. At this time, the common connection and the common drive are possible.

In the cases of FIGS. 6 and 7, the increase of the chip area and that of the access time is attributed to the provision of the idler are almost negligible as easily understood by referring to FIG. 5.

Embodiment 4

Figure 8:
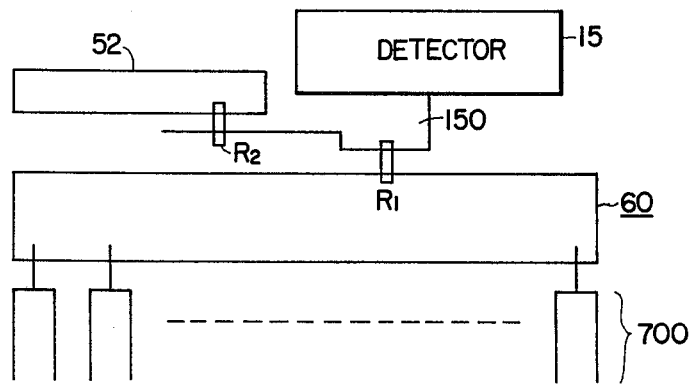

In order to read out a defective loop address, a replicator can be employed instead of the transfer gate. Such embodiment is shown in FIG. 8. In feeding a bubble on the major loop 60 to the detector 15, usually the bubble on the major loop 60 is divided by the use of a replicator $R_1$ and one of the divided bubbles is shifted onto a propagation circuit 150 leading to the detector 15. Then, the bubble is read out by the detector 15. The other divided bubble is left on the major loop 60 and is returned to the minor loop again so as to prevent the data from being destroyed by the read-out.

A second replicator $R_2$ is placed beyond the propagation circuit 150, and an address loop 52 is placed beyond it and stores the necessary defective loop addresses therein. In operation, within the period of time after the transfer-out and before the arrival of the first bubble at the replicator $R_1$, the replicator $R_2$ is actuated to read out the address of the defective loop. Thereafter, control may be made as in Embodiment 1. The replicator $R_2$ may be any insofar as it is caused to act by a current pulse, and it is described in, for example, the aforecited paper by Bobeck et al. As the replicator $R_1$, a passive replicator having hitherto been known is also usable. In order to write the address of the defective loop into the address loop, the replicator $R_2$ may also be operated as a generator, and the address can also be entered from the major loop by reversing the rotating field.

Figure 9:
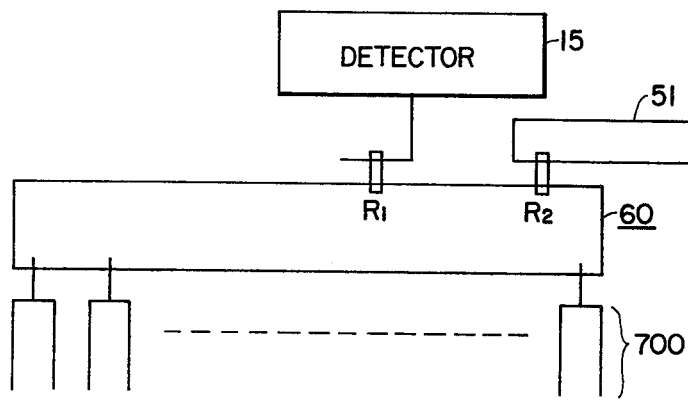

Further, as shown by a replicator $R_2$ and an address loop 51 in FIG. 9, the defective address loop may also be coupled with the major loop 60 by the replicator $R_2$. In operation, the replicator $R_2$ is actuated before or simultaneously with the memory transfer, the contents of the defective address loop are divided and replicated in the major loop, and control is made by reading them out.

As described above in detail, according to this invention, the defective loop address information is stored in the storage circuit provided in the memory chip, so that the address information can be taken out without using any special detector or the like and without spoiling the access time. The invention is greatly effective when applied to the shift register type memory.

What is claimed is:

1. A shift register type memory device comprising a plurality of storage loops which store data and which have at least one alternative loop to be substituted for a defective loop, means to write data into said storage loops, a defective loop address memory which is constructed on the same storage medium as that of said storage loops and which stores a defective loop address in binary expression, a common detector which detects the information of said defective loop address memory and the data of said storage loops, a common propagation circuit which propagates the data read out from said defective loop address memory and said storage loops to said detector, and control means for rearranging the order of a pulse train of the data to be written by the data writing means or which has been read out by said detector on the basis of the defective loop address information detected by said detector to avoid the use of defective loops.

2. A shift register type memory according to claim 1, wherein said defective loop address memory is coupled to said common propagation circuit at a point which allows said common detector to read the data from said defective loop address memory prior to reading the data from said storage loops.

3. A shift register type memory device according to claim 1, wherein said storage medium is a magnetic substance, and said data and said information of said defective loop address memory are represented by magnetic bubbles.

4. A shift register type memory device according to claim 3, wherein said defective loop address memory consists of a plurality of closed loops, and an identical information is written into all bits of each of said loops.

5. A shift register type memory device according to claim 3, wherein said defective loop address memory consists of a plurality of idlers.

6. A shift register type memory device according to claim 3, wherein said defective loop address memory consists of a single closed loop.

7. A shift register type memory device according to claim 3, wherein said defective loop address memory is directly coupled with said propagation circuit.

8. A shift register type memory device according to claim 3, wherein said defective loop address memory is coupled through a separate propagation circuit for the defective loop address information with said common propagation circuit.

9. A shift register type memory device comprising a plurality of minor storage loops which store data including at least one alternative loop to be substituted for a defective loop, a major storage loop for propagating data read out from said minor storage loops and data to be read into said minor storage loops, input means connected to said major storage loop for writing data into said major storage loop, means for selectively gating data in parallel between said minor storage loops and said major storage loop, a defective loop address memory coupled to said major storage loop which is constructed on the same storage medium as that of said minor storage loops and which stores a defective loop address in binary expression, a common detector which detects the information of said defective loop address memory and the data of said minor storage loops gated through said major storage loop, and control means for rearranging the order of a pulse train of data to be written into said storage loops or which has been read out by said detector on the basis of the defective loop address information detected by said detector to avoid the use of defective loops.

10. A shift register type memory device according to claim 9 wherein said control means is connected to the input of said input means and the output of said detector to operate on the pulse train applied to said input means and the pulse train derived from said detector.

11. A shift register type memory device according to claim 9 wherein said control means includes at least one delay element to which said pulse train is applied and counter means responsive to said defective loop address information for selectively outputting said pulse train from the output of said delay element or bypassing said delay element.

12. A shift register type memory device according to claim 11 wherein said minor storage loops include a plurality of alternative loops and said control means includes a number of delay elements equal to the number of alternative loops.

* * * * *